United States Patent [19]

Muroyama

[11] Patent Number: 5,728,308

[45] Date of Patent: Mar. 17, 1998

[54] METHOD OF POLISHING A SEMICONDUCTOR SUBSTRATE DURING PRODUCTION OF A SEMICONDUCTOR DEVICE

[75] Inventor: Masakazu Muroyama, Kanagawa, Japan

[73] Assignee: Sony Corporation, Japan

[21] Appl. No.: 650,310

[22] Filed: May 20, 1996

[30] Foreign Application Priority Data

May 26, 1995 [JP] Japan .................................. 7-127802

[51] Int. Cl.$^6$ ................................................ C23F 3/00
[52] U.S. Cl. ........................... 216/88; 216/89; 156/636.1
[58] Field of Search ........................... 156/636.1; 216/88, 216/89; 252/79.1

[56] References Cited

U.S. PATENT DOCUMENTS

| | | | |
|---|---|---|---|
| 4,608,293 | 8/1986 | Wada et al. ........................... | 428/141 |
| 5,525,191 | 6/1996 | Maniar et al. ........................ | 156/636.1 |
| 5,527,423 | 6/1996 | Neville et al. ....................... | 156/636.1 |

*Primary Examiner*—R. Bruce Breneman
*Assistant Examiner*—Anita Alanko
*Attorney, Agent, or Firm*—Ronald P. Kananen

[57] ABSTRACT

A chemical mechanical polishing slurry comprised of particulates of metal oxide material including at least two metals with oxides having significantly different points of zero charges dispersed in pure water; a method of production of a chemical mechanical polishing slurry including a step of using two or more types of organometallic compounds comprised of at least two types of metal atoms with oxides having significantly different points of zero charges bonded with oxygen atoms for emulsion polymerization so as to form particulates including metal oxide material and a step of dispersing the particulates in pure water; a method of polishing using the chemical mechanical polishing slurry for chemical mechanical polishing of a polishing surface of a substrate so as to smooth the substrate; and a method of producing of a semiconductor device including a step of using the chemical mechanical polishing slurry for chemical mechanical polishing of a polishing surface of a substrate so as to smooth the substrate.

14 Claims, 3 Drawing Sheets

METHOD OF POLISHING A SEMICONDUCTOR SUBSTRATE DURING PRODUCTION OF A SEMICONDUCTOR DEVICE

BACKGROUND OF THE INVENTION

1. Field of the Invention

The present invention relates to a chemical mechanical polishing slurry used for a chemical mechanical polishing (CMP) step in a process for production of a semiconductor device, for example. Further, it relates to a method of production of a chemical mechanical polishing slurry, a method of polishing using that slurry, and a process of production of a semiconductor device using the same.

2. Description of the Related Art

In recent years, the increasing miniaturization and density of semiconductor devices has led to an increasing miniaturization and complexity of layers of interconnection patterns connecting those devices. The increasing miniaturization and density of semiconductor devices also causes larger and sharper step differences in the interlayer insulating film, which causes the precision of processing and reliability of the interconnection pattern formed on top of the insulating film to decrease and the reliability of the semiconductor device itself to decrease. Therefore, at the present time, where it is difficult to greatly improve the coverage of step differences by interconnection layers including aluminum materials formed by the sputtering method, it is becoming necessary provide a smoother upper surface for the interlayer insulating film.

In the past, the following techniques for smoothing the interlayer insulating film, were known: the method of coating spin-on glass (SOG), the method of smoothing the insulating film by applying a resist material, then etching back these together to smooth surface, and the method of causing reflow of the insulating film by heat treatment.

When forming an interlayer insulating film using these techniques, if there is an interconnection pattern with large intervals between interconnections, there is still on insufficient by smooth surface and the precision of processing and reliability of the interconnection pattern formed on the surface is decreased. Conversely, with an interconnection pattern with narrow intervals between interconnections, it is not possible to sufficiently bury the gaps between interconnections with the interlayer insulating film and therefore the problem of cavities occurs.

Therefore, in recent years, attention has been drawn to smoothing the interlayer insulating films by chemical mechanical polishing. In this method of polishing, a wafer is smoothed by rubbing a surface of the wafer on which an insulating film is formed a polishing cloth stretched over a rotary lathe while supplying a slurry.

Here, an explanation will be made of an example of chemical mechanical polishing to smooth the interlayer insulating film shown in FIG. 1 to FIG. 3.

First, as shown in FIG. 1, a silicon oxide film is formed by plasma CVD using tetraethoxysilane (TEOS) as the organosilicon compound on a wafer comprised of a silicon substrate 11 on which are formed a thin silicon oxide film 12 and an interconnection pattern 13 including an aluminum material so as to form the interlayer insulating film 14 as shown in FIG. 2.

Next, the projecting portions in the interlayer insulating film 14 are removed by chemical mechanical polishing, so as to smooth the interlayer insulating film 14 as shown in FIG. 3.

The slurry used for chemical mechanical polishing, may have particulates comprised of metal oxides such as silica ($SiO_2$), alumina ($Al_2O_3$), titanium oxide ($TiO_2$), and cerium oxide ($CeO_2$) of a particle size of about 10 nm in an aqueous solution of potassium hydroxide (KOH). Note that the above-mentioned metal oxides are generally formed by high temperature gaseous hydrolysis. For example, if dichlorosilane is introduced into a flame of over 1000° C. produced by an oxyhydrogen burner to cause high temperature gaseous hydrolysis, then a powdery fumed silica is obtained.

The reason why an aqueous solution of KOH is used as the slurry is the chemical polishing effect exhibited. On the other hand, the particulates are added to the slurry to cause the mechanical polishing effect. Silica, which is most generally used as the particulates, is an acidic oxide, so sufficient dispersion of the particles in a basic solvent such as an aqueous solution of potassium hydroxide can be ensured.

Alternatively, in Extended Abstracts of the 1994 International Conference on Solid State Devices and Materials, 1994, pp. 934 to 936, a slurry has been proposed which increases the aggregate particle size (also called secondary particle size) without using a basic solvent by adding a salting out agent such as ammonium chloride ($NH_4Cl$) to deliberately lower the dispersion of the silica.

If such a slurry is used, then it becomes possible to increase the polishing speed and further to prevent contamination by potassium (K) and sodium (Na) which has been a problem in the process of production of semiconductor devices. Therefore, it becomes possible to set the polishing apparatus in a clean room and greatly reduce the costs for the apparatus due to the elimination of the need for a specialized chamber.

However, in such a slurry, the state of aggregation of the particulates varies greatly with the concentration of the salting out agent or the pH of the solvent. This leads to major changes in the polishing speed. Further, when the state of aggregation of the particulates changes, the amount of the particulates remaining on the wafer after polishing by the slurry and cleaning also changes. Further, when the state of aggregation changes and the aggregate particle size becomes much larger than the desired value, there is a danger that the particulates will damage the surface of the substrate being polished.

OBJECT AND SUMMARY OF THE INVENTION

Therefore, an object of the present invention is to provide a chemical mechanical polishing slurry with a stably controlled state of aggregation of the particulates.

Another object of the present invention is to provide a method of producing a chemical mechanical polishing slurry.

A still further object of the present invention is to provide a method of polishing using the chemical mechanical polishing slurry.

A still further object of the present invention is to provide a method of producing of a semiconductor device using the above chemical mechanical polishing slurry and method of polishing using the same.

According to a first aspect of the present invention, there is provided a chemical mechanical polishing slurry including a particulate material containing at least two metals or metal oxides dispersed in pure water where the metals or oxides have significantly different points of zero charge from each other.

Preferably, the particulate material exhibits an aggregate particle size in accordance with the ratio between contents of the at least two metals or oxides.

Preferably, one type of the metal atom is a silicon atom.

According to a second aspect of the invention, there is provided a method of producing a chemical mechanical polishing slurry including a step of using two or more types of organometallic compounds comprised of at least two types of metals with significantly different points of zero charges of oxides bonded with oxygen atoms for emulsion polymerization so as to form particulates comprised of a metal oxide material and a step of dispersing the particulates in pure water.

Preferably, the aggregate particle size of the particulates is controlled by the ratio of mixing of the two or more types of organometallic compounds.

Preferably, after the emulsion polymerization, the particulates are sintered before dispersion in the pure water.

Preferably, as one type of the organometallic compound, use is made of an organosilicon compound.

According to a third aspect of the invention, there is provided a method of polishing using a chemical mechanical polishing slurry including particulates of a metal oxide material including at least two oxides of metals with significantly different points of zero charges dispersed in pure water for chemical mechanical polishing of a polishing surface of a substrate so as to smooth the substrate.

Preferably, as the particulates, use is made of one exhibiting an aggregate particle size in accordance with the ratio between contents of at least two metals.

Preferably, one type of metal is a silicon atom and the polishing surface includes a silicon oxide material.

According to a fourth aspect of the invention, there is provided a method of producing a semiconductor device including a step of using a chemical mechanical polishing slurry including particulates of a metal oxide material including at least two oxides of metals with significantly different points of zero charges dispersed in pure water for chemical mechanical polishing of a polishing surface of a substrate so as to smooth the substrate.

Preferably, particulate material exhibits an aggregate particle size in accordance with the ratio between contents of at least two metals.

Preferably, one type of the metal atom is a silicon atom and the polishing surface is comprised of a silicon oxide material.

BRIEF DESCRIPTION OF THE DRAWINGS

These and other objects and features of the present invention will become more apparent from the following description of the preferred embodiments made with reference to the attached drawings, in which.

DETAILED DESCRIPTION OF THE PREFERRED EMBODIMENTS

Figure 1:
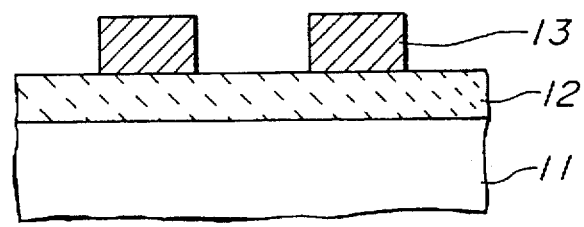
FIG. 1 is a cross-sectional view of a wafer including a silicon substrate on which is formed a silicon oxide film and an interconnection pattern formed on the top of the same.

The chemical mechanical polishing slurry according to the present invention includes a particulate material containing oxides of at least two metals with significantly different points of zero charges (PZCs) dispersed in pure water.

Note that if the metal oxide material constituting the particulates includes metal-oxygen atom bonds, then it does not have to be a metal oxide having a stoichiometric composition and may be a mixture of at least two metals or a mixture of at least two metal oxide materials. However, it is preferable that the particulates include metal oxide materials of the same composition from the surface to the depths.

The reason why at least two metals with significantly different points of zero charges of the oxides are included in the particulate metal oxide material is to adjust the charge on the surface of the particulates and thereby control the state of aggregation of the particulates. Therefore, the at least two metals whose oxides have significantly different points of zero charges from each other, meaning that the oxide of one metal gives a different charge from that of the oxide of another metal, and the former gives a state of particle aggregation different from the latter.

Note that the amount of the charge on the surface of the particulates changes depending on the ratio of the metals included in the metal oxide materials. Therefore, in the chemical mechanical polishing slurry according to the present invention, it is preferable to use particulates controlled in aggregate particle size in accordance with the ratio of the metals.

When selecting a metal to be included in the metal oxide materials one should be chosen which charges exhibit a superior property of dispersion of the oxides in pure water. It is preferable to select as another metal one which enables a change in the amount of the charge so as not to lower the dispersion in pure water.

For example, $SiO_2$ is used in general as a particulate of a chemical mechanical polishing slurry. Particles including only $SiO_2$ have a constant negative charge in pure water and exhibit a superior dispersion. If metal giving oxides having a larger PZC than the PZC of $SiO_2$ are included such as $TiO_2$, $Al_2O_3$, and ZnO, the particulates have a smaller negative charge than the particulates comprised solely of $SiO_2$ and easily aggregate. Of course, in addition to the above combinations, it is possible to make changes such as combining metal atoms with relatively large points of zero charge of oxides such as $Al_2O_3$, ZnO, BeO, $Y_2O_3$, $CeO_2$, $PbO_2$, and MgO with metal atoms with relatively small points of zero charges of oxides such as $TiO_2$, $Sb_2O_3$, $WO_3$, and MnO. Note that the metals to be included in the metal oxide material are not limited to two types. Three or more types of metal may also be included.

The method of producing a chemical mechanical polishing slurry according to the present invention is a method for producing a chemical mechanical polishing slurry having the above configuration and includes a step of forming particulates comprised of a metal oxide material by using two or more types of organometallic compounds comprising at least two metals with significantly different points of zero charges of the oxides bonded with oxygen atoms for emulsion polymerization and a step of dispersing the particulates in pure water.

In the present invention, in the emulsion polymerization, it is preferable to adjust the charge on the surface of the particulates obtained to a desired value and to control the aggregate particle size of the particulates by the ratio of mixture of the two or more types of organometallic compounds.

However, to produce a metal oxide material by emulsion polymerization, it is sufficient for example to first form micelles comprised of a surfactant in an aqueous phase and a solvent insoluble with the aqueous phase, cause two or more types of organometallic compounds serving as materials for the metal oxide material to disperse in the micelles, and causing hydrolysis of the organometallic compounds by the permeation of water into the micelles. Note that as the organometallic compound, preferably one having a molecular structure wherein all of the bonding arms of the metal atom bond with an oxygen atom and an organic substituent bonds with the metal atom through the oxygen atom. An organometallic compound having such a molecular structure forms a metal oxide material having a chemical structure repeating the metal-oxygen bonds by the release of the organic substituent by hydrolysis.

If hydrolysis is promoted in the micelles in this way, the granular shape of the metal oxide material formed becomes substantially spherical in accordance with the micelle shape which receives uniform pressure from the surroundings and is made substantially spherical. Further, it is possible to restrict the granular size of the metal oxide material produced inside by the magnitude of the micelles.

Note that the composition and hardness of the organometallic compounds produced can be controlled by the molecular structure of the organometallic compounds used as the materials or the conditions of the hydrolysis, but it is possible to approach the stoichiometric composition and raise the hardness by sintering after production.

As the material, a suitable combination of two or more types of organometallic compounds having metal atoms to be incorporated in the metal oxide material may be used such as Si, Ge, Ti, Sb, W, Mn, Al, Be, Y, Ce, Pb, and Mg.

In particular, a metal oxide material containing Si atoms is easily applied as particulates for chemical mechanical polishing. In this case, as one of the organometallic compounds used as a material, use is made of an organosilicon compound, but use of one wherein all of the four bonding arms of the Si atom bond to the organic substituent through an oxygen atom is preferable. More specifically, mention may be made of tetramethoxysilane, tetraethoxysilane, tetraisopropoxy-silane, tetratertialbutoxysilane, and other alkoxysilanes, diisopropoxydiacetosilane and other alkoxyacetosilanes, hexamethyldisiloxane, and other chain polysiloxanes, octamethylchlorotetrasilane, tetramethylcyclotetrasiloxane, and other ring-like polysiloxanes, etc.

Note that it is also possible to add a polymerization stopper during the production of the metal oxide material by emulsion polymerization so as to stop the reaction and control the granularity of the metal oxide material. The polymerization stopper preferably is an organometallic compound which contains the same metal atom as an organometallic compound serving as the material of the metal oxide material and has a molecular structure in which one of the bonding arms of the metal atom is bonded with the organic substituent through an oxygen atom and the rest of the bonding arms have organic substituents bonded to them directly. If such a polymerization stopper is added, the bonding arm bonding with the organic substituent through the oxygen atom will bond with the reaction product of the two material organometallic compounds, but the bonding arms with the organic substituents directly bonded will not bond with the reaction product, so in the end the material organometallic compounds will not be able to react with each other further than that.

As the material of the surfactant used for forming the micelles in the pure water, use may be made of ethers or esters having a polyethylene alcohol or polyhydric alcohol as a hydrophilic group, sorbic acid fatty acid ester, fatty acid monoglycerides, and other anionic activants or conventionally known positive ion activants. Examples of anionic activants include stearic acid, polyethyleneoxide stearate, polyethyleneoxide laurate, nonylphenol ethylene oxide, polyethyleneoxide oleate, amine ethyleneoxide stearate, amine ethyleneoxide oleate, polypropylene glycol ethyleneoxide, glycerine laurate monoester, pentaerythritol-monostearate ester, sorbite palmate monoester, laurate diethanol amide, etc. Examples of positive ion activants, includes dimethyl ammonium chloride, tetramethyl ammonium chloride, laurylmethyl ammonium chloride, lauryltrimethyl ammonium chloride, monoethanol aminomonostearate, triethanolamine monostearate, hydroxyethyl stearylamine, etc.

Note that to produce the metal oxide material, it is also possible to use the suspension polymerization method instead of the emulsion polymerization method. In this method as well, it is possible to control the particle size by adjusting the degree of suspension. Further, it is possible to maintain the stability of the suspension by stirring, bubbling, etc.

Further, the method of polishing according to the present invention may be used for smoothing of a substrate by chemical mechanical polishing using the chemical mechanical polishing slurry produced in this way.

That is, it is possible to use a chemical mechanical polishing slurry including a particulate material containing oxides of at least two metals with significantly different points of zero charges so as to perform chemical mechanical polishing on the polishing surface of the substrate and smooth the substrate.

This polishing is suitably used for the production of a semiconductor device. As the particulates, a metal oxide material containing silicon atoms maybe used and the polishing is suitably performed on a substrate with a polishing surface comprised of $SiO_2$. Note that in addition to polishing a layer comprised of $SiO_2$, it is also possible to polish a layer comprised of silicon oxide containing at least one impurity selected from the group comprised of boron (B), phosphorus (P), arsenic (As), etc., SiN and SiON containing nitrogen (N), SiOF containing fluorine (F), and SiBN, SiOBN, etc. containing B and N.

The method of polishing of the present invention preferably is used when smoothing an interlayer insulating film formed on a wafer having an uneven surface. Further, it may be used for the formation of so-called trench isolation, that is, for removal of portions of an insulating film, formed over a semiconductor substrate having grooves and filling the same, other than inside the grooves and can be used for the formation of a silicon active layer using a silicon on insulator (SOI) substrate. Further, it is possible to use it in the formation of a so-called buried plug formed by filling an electroconductive material into a connection hole for connecting upper and lower interconnections.

Figure 5:
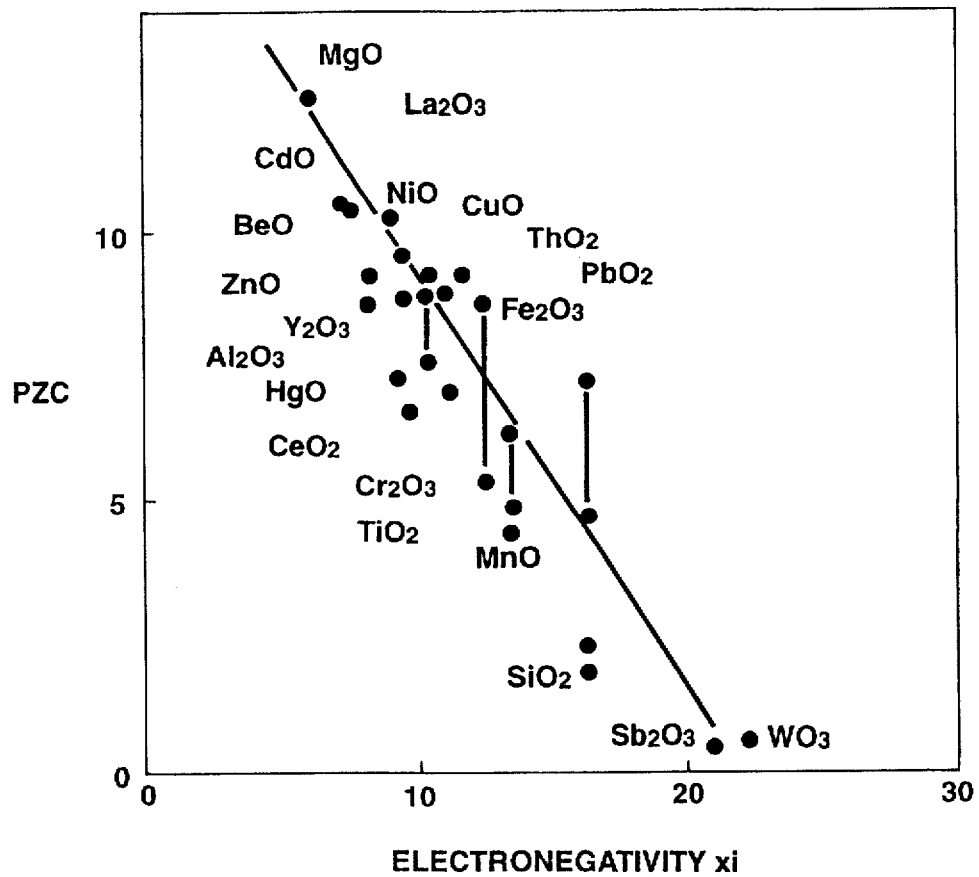
FIG. 5 is a graph of the relationship between the electronegativity of the metal ions and points of zero charges PZC for various metal oxides.

The particulates of the metal oxides in the aqueous solution change the charge polarity of the hydroxyl group on the surface in accordance with the pH of the aqueous solution. Specifically, in an aqueous solution with a low pH, protons are added to make a positive charge. In an aqueous solution with a high pH, the protons are withdrawn and the charge becomes negative. Note that the pH of the aqueous solution giving an apparent zero charge on the surface of the particulates is called the point of zero charge (PZC). FIG. 5 shows the PZC of various metal oxides.

For example, when the particulates are comprised of $SiO_2$, which has a point of zero charge of about 2, the charge becomes negative in pure water and a stable dispersion is maintained, but if aluminum atoms are included in addition to the silicon atoms in the metal oxide material containing the particulates, since the point of zero charge of $Al_2O_3$ is 7.5 to 8.5 or so, an increase in the content of the aluminum atoms will be accompanied by a decline in the amount of the negative charge and easier aggregation of the particulates. That is, by including in a predetermined ratio at least two metals with significantly different points of zero charge in the metal oxide material constituting the particulates, it is possible to adjust the amount of the charge of the particulates in the pure water to a desired value and possible to stably control the state of aggregation of the particulates and control the aggregate particle size to a desired size.

Further, in the present invention, since the particulates are made to disperse in pure water and no salting out agent or basic solvent is used, there is no concern over a change in the state of dispersion of the particulates due to changes in the concentration of the salting out agent or the pH of the aqueous solution and it is possible to obtain a state of aggregation which is always stable. Note that since no basic solvent is used, contamination by potassium or sodium can also be prevented.

Further, if the particulates are comprised of a metal oxide material of the same composition from the surface portion to the core portion, even if the particulate surface is worn down by the polishing, there will be no change in the charge of the surface portion and a constant state of aggregation can be maintained.

When producing the above-mentioned slurry, if the particulates are prepared using the emulsion polymerization method, since it is easy to include at least two metals in a predetermined ratio, it becomes easy to adjust the charge of the particulates. Further, since the size of the particulates is made uniform and the shape becomes substantially spherical, the slurry does not damage the polishing surface of the substrate.

If a chemical mechanical polishing slurry including the above-mentioned particulates dispersed in pure water is used for polishing a substrate, due to the superiority of the control and uniformity of the aggregate particle size of the particulates, it becomes possible to polish stably under the desired conditions and to improve the polishing speed.

EXAMPLES

Below, the chemical mechanical slurry, method of producing the same, and method of polishing using the same according to the present invention will be explained with reference to specific examples.

Example 1

Below, an explanation will be made of an example of the chemical mechanical polishing slurry and the method of producing the same.

The slurry of this example is made by the dispersion in pure water of particulates comprised of a metal oxide material comprised of Si—O bonds and Ti—O bonds.

To produce this slurry, first, 50 ml of o-xylene and 1 ml of stearic acid were added to 1000 ml of pure water, then mixed to form micelles. Note that the size of the micelles formed was an average 200 nm. Next, 10 ml of tetraethoxysilane and 3 ml of tetratertialbutoxy titanate were added and dispersed in the micelles. The mixture was then heated to 150° C. Due to this, water permeated into the micelles and a hydrolysis reaction was caused to form a metal oxide material.

After the end of the reaction, rinsing was used to remove the o-xylene and the stearic acid. The obtained metal oxide material was sintered at 800° C. for 30 minutes to obtain particulates comprised of a metal oxide material comprised of Si—O bonds and Ti—O bonds.

Next, the above-mentioned particulates were made to disperse in pure water to a concentration of 12 percent by weight to obtain the chemical mechanical polishing slurry. This was used as the slurry of Example 1.

Here, for comparison, a slurry using particulates comprised of only $SiO_2$ and not containing Ti atoms (slurry of Comparative Example 1) was prepared. Specifically, micelles were formed in pure water in the same way as in Example 1, then 10 ml of tetraethoxysilane was added, with no addition of tetratertialbutoxy titanate. Next, hydrolysis and sintering were performed in the same way as in Example 1 to obtain particulates comprised of $SiO_2$. These were made to disperse in pure water in the same way as Example 1 to obtain the slurry of Comparative Example 1.

Further, the slurry of Example 1 obtained in the above manner and the slurry of Comparative Example 1 were compared. It was found that the slurry of Example 1 had a larger aggregate particle size of particulates than the slurry of Comparative Example 1. This was because the point of zero charge of the $SiO_2$ is about 2, while the point of zero charge of $TiO_2$ is approximately 4.5 to 6.5, so particulates comprised of a metal oxide material including Ti atoms can reduce the negative charge in pure water even more than particulates comprised of a $SiO_2$.

Example 2

In this example, a slurry with a higher aggregation of particulates than even the slurry of Example 1 was prepared.

The slurry of this example is one made by the dispersion in pure water of particulates comprised of a metal oxide material comprised of Si—O bonds and Zn—O bonds.

To produce this slurry, first, 50 ml of o-xylene and 1 ml of myristic acid were added to 1000 ml of pure water, then mixed to form micelles. Note that the size of the micelles formed was an average 200 nm. Next, 10 ml of tetraethoxysilane and 10 g of zinc diethoxy were added and dispersed in the micelles. The mixture was then heated to 150° C. Due to this, water permeated into the micelles and a hydrolysis reaction was caused to form a metal oxide material.

After the end of the reaction, rinsing was used to remove the o-xylene and the myristic acid. The obtained metal oxide material was sintered at 800° C. for 30 minutes to obtain particulates comprised of a metal oxide material comprised of Si—O bonds and Zn—O bonds.

Next, the above-mentioned particulates were made to disperse in pure water to a concentration of 12 percent by weight to obtain the chemical mechanical polishing slurry. This was used as the slurry of Example 2.

Here, the slurry of Example 2 and the slurry of Example 1 were compared, whereupon it was found that the slurry of Example 2 had a further larger aggregate particle size of particulates than even the slurry of Example 1. This was because the point of zero charge of the ZnO is approximately 8.5, i.e., larger than even the point of zero charge of $TiO_2$, so particulates comprised of a metal oxide material including zinc atoms can reduce the negative charge even more than particulates including a metal oxide material including titanium atoms.

Example 3

In this example, an explanation will be made of a method of polishing using the chemical mechanical polishing slurry prepared in the following manner.

Figure 4:
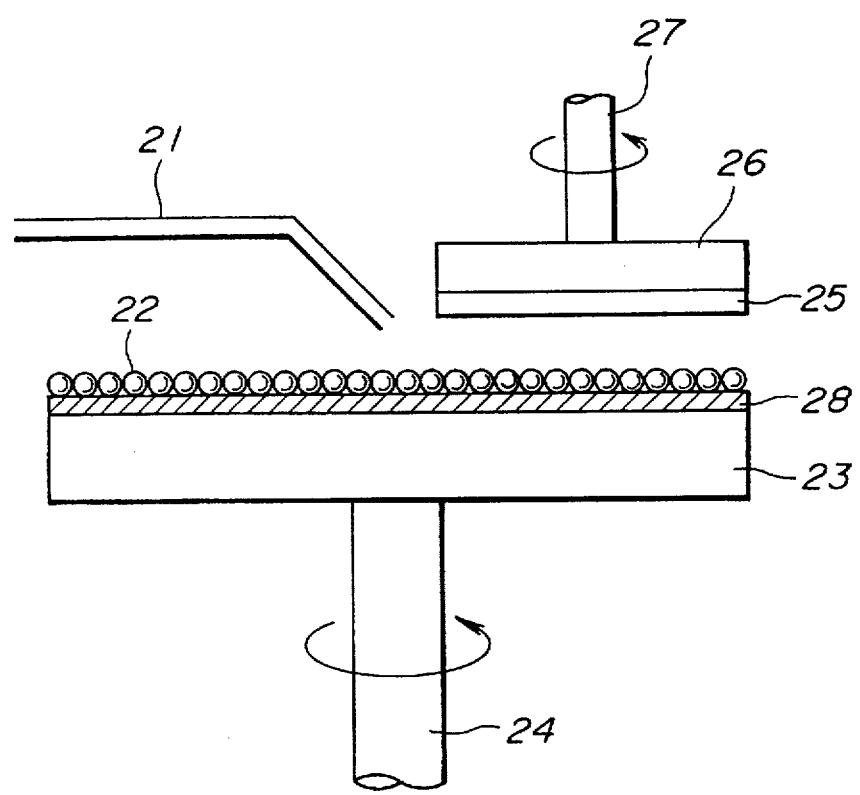
FIG. 4 is a schematic view of an example of the configuration of the polishing apparatus used in the present invention.

Here, before explaining the actual method of polishing, an explanation will be made, referring to FIG. 4, of an example of the configuration of the polishing apparatus used for the polishing.

The polishing apparatus includes a substrate holding unit for holding a substrate 25 with its polishing surface down and a substrate polishing unit for rubbing against the substrate 25 held in the substrate holding unit.

The substrate holding unit includes a substrate holder 26 including a metal material and having a substrate carrying surface for holding the substrate 25 in close contact and a holder shaft 27 able to turn the substrate holder 26 by a drive mechanism such as a motor, not shown.

On the other hand, the substrate polishing unit includes a polishing cloth 28 for carrying the slurry 22, a rotary lathe 23 over which the polishing cloth 28 is stretched, a lathe shaft 24 able to turn the rotary lathe 23 by a drive mechanism such as a motor, not shown, and a slurry supply pipe 21 for supplying slurry 22 on the polishing cloth 28.

To actually perform the polishing using this polishing apparatus, the substrate 25 is held in the substrate holder 26, this is made to turn about the holder shaft 27, and the rotary lathe 23 is also made to rotate about the lathe shaft 24. The slurry shown in Example 1 is supplied from the slurry supply pipe 21 on to the polishing cloth 28 and the polishing surface of the substrate 25 and the polishing cloth are rubbed against each other under the following polishing conditions so as to polish the polishing surface of the substrate 25:

Polishing Conditions

Rotational speed of rotary lathe 23: 17 rpm

Rotational speed of substrate holder 26: 17 rpm

Polishing pressure: $5.5 \times 10^3$ Pa

Rate of flow of slurry: 200 ml/min

Note that the polishing pressure was controlled by adjusting the force applied to the substrate holder 26 toward the rotary lathe 23 side.

Here, the above-mentioned polishing method was applied to smooth an interlayer insulating film in a process of producing a semiconductor device. This step will be explained using FIG. 1 to FIG. 3.

Figure 2:
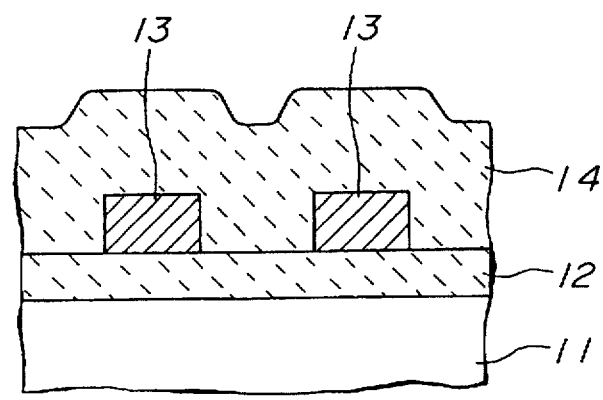
FIG. 2 is a cross-sectional view of the formation of an interlayer insulating film on the wafer of FIG. 1.

First, as shown in FIG. 1, a wafer was prepared including a silicon substrate 11 on which were formed a thin silicon oxide film 12 and an interconnection pattern 13 including an aluminum material, silicon oxide was deposited on this by the following chemical vapor deposition conditions, and an interlayer insulating film 14 was formed over the entire surface of the wafer as shown in FIG. 2.

Conditions for Formation of Interlayer Insulating Film 14

Process gas: TEOS, 800 sccm (He bubbling) $O_2$, 600 sccm

Pressure: 1330 Pa

Temperature: 400° C.

RF power: 700W

Note that the interlayer insulating film 14 obtained was superior in coverage and was able to sufficiently bury the portions between the interconnection pattern 13.

Figure 3:
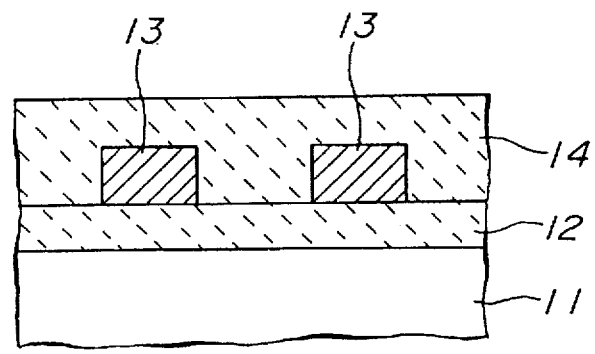
FIG. 3 is a cross-sectional view after removal of the projecting portions of the interlayer insulating film by polishing the wafer of FIG. 2.

After this, the above-mentioned wafer (substrate) was held on the substrate holder 26 so that the surface on which was formed the interlayer insulating film faced the polishing cloth 28 and polishing was performed while supplying the slurry shown in Example 1. As shown in FIG. 3, the projecting portions of the interlayer insulating film 14 were removed and sufficient polishing was performed.

Here, for comparison, the same type of polishing was performed using the slurry of Comparative Example 1 ($SiO_2$ particulates dispersed in pure water) instead of the slurry of Example 1, whereupon it was found that the polishing by the example of the present invention was faster in polishing speed. Due to this, it was learned that the particulates included in the slurry of Example 1 were larger in aggregate particle size than even the particulates included in the slurry of Comparative Example 1.

Note that when this example was applied, then there was no change in the polishing speed or other polishing characteristics during the polishing. This was because there was no change in the aggregate particle size of the particulates in the slurry along with time and the aggregation was controlled stably.

Further, no damage was seen to appear on the polishing surface of the wafer. There was also no subsequent roughening of the surface of the wafer even when the slurry was removed by an aqueous solution of hydrofluoric acid. This was because the particulates were prepared by emulsion polymerization and therefore the particulates were uniform in size and substantially spherical in shape and, as explained above, the aggregate particle size of the particulates was uniform.

Example 4

Example 4 shows a method of polishing faster than that shown in Example 3.

Specifically, the polishing was performed using the same type of polishing apparatus as in Example 3 and under the same polishing conditions etc. as Example 3 except that use was made of the slurry shown in Example 2 instead of the slurry shown in Example 1.

This method of polishing, like in Example 3, when applied to polishing of the interlayer insulating film 14, allowed the projecting portions of the interlayer insulating layer 14 to be removed. Note that it was found that the polishing speed became faster than Example 3 and that the particulates contained in the slurry of Example 2 were larger in aggregate particle size compared with the particulates contained in the slurry of Example 1.

Further, it was found that since there was no change in the polishing speed and other polishing characteristics over time during the polishing, there was no change of the aggregate particle size of the particulates in the slurry over time and the aggregation could be controlled stably. Further, the polishing did not cause any toughening of the polishing surface of the wafer.

The present invention was explained above with reference to examples of a chemical mechanical polishing slurry, method of production of the slurry, and method of polishing using the slurry, but is not limited to the above examples. For example, the materials making up the particulates and the method of production can be appropriately modified within the scope of the claims. For instance, in Examples 1 and 2, the particulates included a metal oxide material containing two metals, but it may contain three or more as well.

The polishing apparatus used can be modified so as to improve the in-plane uniformity of the polishing by for example making it possible to control the temperature of parts of the rotary lathe or substrate holder.

Further, the method of polishing according to the third aspect of the invention can be applied for the formation of so-called trench isolation in addition to smoothing an interlayer insulating film, that is, for removal of portions of an insulating film, formed over a semiconductor substrate having grooves and filling the same, other than inside the grooves and can be applied for the formation of a silicon active layer using a silicon on insulator (SOI) substrate. Further, it is possible to apply it to the formation of a so-called buried plug formed by filling an electroconductive material into a connection hole for connecting upper and lower interconnections.

As clear from the above explanation, the present invention provides a chemical mechanical polishing slurry wherein the aggregate particle size of the particulates can be controlled to be uniform without changes over time, so when polishing a substrate using the slurry, it is possible to stably control the polishing speed and other polishing characteristics. This raises the polishing speed without damaging the substrate.

Accordingly, by applying the present invention to the smoothing step of a process of producing of a semiconductor device, it is possible to improve the reliability of the smoothing step.

Further, since no basic solvent is used for the slurry, it is possible to prevent contamination by potassium and sodium and thereby tremendously reduce the costs entailed in facilities by performing the polishing in a clean room.

What is claimed is:

1. A method of polishing using a chemical mechanical polishing slurry comprising:

polishing a substrate with said slurry;

providing in said slurry particulates of at least two different metal oxides dispersed in pure water, wherein said at least two different metal oxides have different points of zero charges; and controlling an aggregate particle size of said particulates by controlling a ratio of said at least two different metal oxides in said slurry.

2. A method of polishing as set forth in claim 1, wherein said at least two metal oxides having points of zero charges that differ by a difference of 4.5 to 6.5.

3. A method of polishing as set forth in claim 2, wherein one of said metal oxides is a silicon oxide and said substrate has a polishing surface comprised of a silicon oxide material.

4. A method as set forth in claim 1, wherein said substrate has at least one semiconductor device formed thereon.

5. A method as set forth in claim 1, wherein one of said metal oxides is a silicon oxide and said substrate has a polishing surface comprised of a silicon oxide material.

6. A method as set forth in claim 1, further comprising selecting $SiO_2$ and $TiO_2$ as two of said at least two metal oxides.

7. A method as set forth in claim 1, further comprising selecting $SiO_2$ and $ZnO$ as two of said at least two metal oxides.

8. A method as set forth in claim 4, further comprising using said polishing for trench isolation.

9. A method as set forth in claim 4, further comprising using said polishing for forming a buried plug.

10. A method as set forth in claim 1, further comprising pressing said polishing surface against a rotating polishing lathe during said polishing.

11. A method as set forth in claim 10, further comprising rotating said polishing surface wherein said polishing surface and said polishing lathe rotate in one direction.

12. A method as set forth in claim 10, further comprising controlling the temperature of said lathe or of a holder holding said substrate during polishing.

13. A method as set forth in claim 1, further comprising removing said slurry from said substrate after polishing.

14. A method as set forth in claim 13, further comprising removing said slurry using an aqueous solution of hydrofluoric acid.

* * * * *